(12) United States Patent
Kimura et al.

(10) Patent No.: US 9,780,759 B2
(45) Date of Patent: Oct. 3, 2017

(54) ELASTIC WAVE DEVICE AND METHOD FOR MANUFACTURING THE SAME

(71) Applicant: Murata Manufacturing Co., Ltd., Nagaokakyo-shi, Kyoto-fu (JP)

(72) Inventors: Tetsuya Kimura, Nagaokakyo (JP); Takashi Ogami, Nagaokakyo (JP); Katsuya Daimon, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 810 days.

(21) Appl. No.: 13/920,344

(22) Filed: Jun. 18, 2013

(65) Prior Publication Data

US 2014/0152146 A1 Jun. 5, 2014

Related U.S. Application Data

(63) Continuation of application No. PCT/JP2011/078696, filed on Dec. 12, 2011.

(30) Foreign Application Priority Data

Dec. 24, 2010 (JP) ................................. 2010-287505

(51) Int. Cl.
*H03H 9/02* (2006.01)
*H01L 41/18* (2006.01)
(Continued)

(52) U.S. Cl.
CPC ......... *H03H 9/02535* (2013.01); *H01L 41/18* (2013.01); *H01L 41/1873* (2013.01);
(Continued)

(58) Field of Classification Search
CPC ........................... H03H 9/02535; H03H 9/058
(Continued)

(56) References Cited

U.S. PATENT DOCUMENTS 6,603,241 B1 8/2003 Barber et al.
2006/0131998 A1* 6/2006 Aoki ....................... H03H 3/08
310/340

(Continued)

FOREIGN PATENT DOCUMENTS

EP  2 226 934 A1  9/2010
FR  2 882 205 A1  8/2006
(Continued)

OTHER PUBLICATIONS

Official Communication issued in International Patent Application No. PCT/JP2011/078696, dated Jan. 31, 2012.
(Continued)

*Primary Examiner* — Derek Rosenau
(74) *Attorney, Agent, or Firm* — Keating & Bennett, LLP

(57) ABSTRACT

An elastic wave device propagating plate waves includes a stack of an acoustic reflection layer, a piezoelectric layer, and IDT electrode on a supporting substrate. The piezoelectric layer is thinner than a period of fingers of the IDT electrode. The acoustic reflection layer includes low-acoustic-impedance layers and high-acoustic-impedance layers. The low-acoustic-impedance layers are made of $SiO_2$, and the high-acoustic-impedance layers are made of at least one material selected from the group consisting of W, $LiTaO_3$, $Al_2O_3$, AlN, $LiNbO_3$, SiN, and ZnO.

18 Claims, 8 Drawing Sheets

(51) Int. Cl.
*H03H 3/02* (2006.01)
*H01L 41/187* (2006.01)

(52) U.S. Cl.
CPC .......... *H03H 3/02* (2013.01); *H03H 9/02228* (2013.01); *H03H 9/02574* (2013.01); *Y10T 29/42* (2015.01)

(58) Field of Classification Search
USPC ...... 310/313 R, 313 A, 313 B, 313 C, 313 D
See application file for complete search history.

(56) References Cited

U.S. PATENT DOCUMENTS

| | | | | |
|---|---|---|---|---|
| 2007/0007851 A1* | 1/2007 | Loebl | ................ | G01N 29/022 |
| | | | | 310/313 B |
| 2008/0179989 A1 | 7/2008 | Ogami et al. | | |
| 2008/0211602 A1* | 9/2008 | Khelif | ................ | H03H 3/04 |
| | | | | 333/193 |
| 2009/0085429 A1* | 4/2009 | Nishiyama | ........ | H03H 9/02559 |
| | | | | 310/313 A |
| 2009/0189483 A1* | 7/2009 | Kadota | ............ | H03H 9/02559 |
| | | | | 310/313 B |
| 2009/0231061 A1 | 9/2009 | Tanaka | | |
| 2010/0072856 A1* | 3/2010 | Kadota | ............ | H03H 9/02559 |
| | | | | 310/313 B |
| 2010/0088868 A1 | 4/2010 | Kando et al. | | |
| 2010/0244626 A1* | 9/2010 | Yamanaka | ........ | H03H 9/02551 |
| | | | | 310/313 B |

FOREIGN PATENT DOCUMENTS

| | | |
|---|---|---|
| JP | 2002-041052 A | 2/2002 |
| JP | 2006-121259 A | 5/2006 |
| JP | 2008-530874 A | 8/2008 |
| WO | 2007/046236 A1 | 4/2007 |
| WO | 2009/081651 A1 | 7/2009 |

OTHER PUBLICATIONS

Official Communication issued in corresponding European Patent Application No. 11850373.9, dated Jul. 1, 2014.

* cited by examiner

FIG. 14
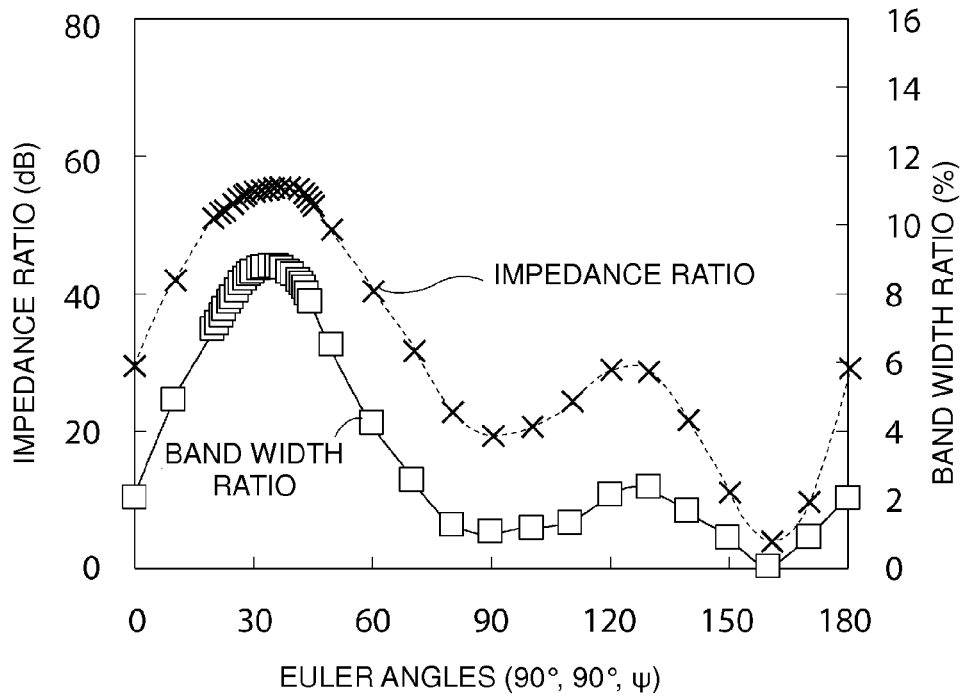
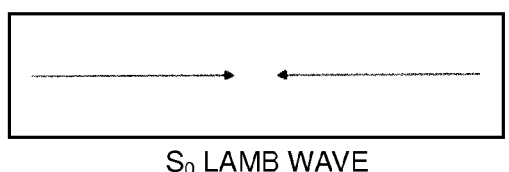
$S_0$ LAMB WAVE
FIG. 15A
$S_1$ LAMB WAVE
FIG. 15B
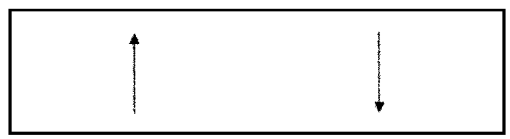
$A_0$ LAMB WAVE
FIG. 15C
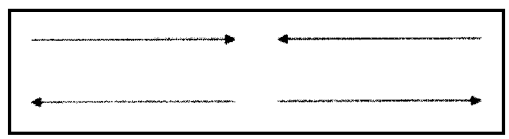
$A_1$ LAMB WAVE
FIG. 15D
$SH_0$ MODE
FIG. 15E
$SH_1$ MODE
FIG. 15F

ELASTIC WAVE DEVICE AND METHOD FOR MANUFACTURING THE SAME

BACKGROUND OF THE INVENTION

1. Field of the Invention

The present invention relates to elastic wave devices preferably for use in resonators and band-pass filters and more specifically to an elastic wave device using plate waves and a method for manufacturing the same.

2. Description of the Related Art

Hitherto researchers have proposed elastic wave devices that employ different elastic waves such as Rayleigh waves or SH (shear horizontal) waves. Japanese Unexamined Patent Application Publication No. 2008-530874 discloses an elastic wave device that uses plate waves.

The elastic wave device disclosed in Japanese Unexamined Patent Application Publication No. 2008-530874 has a silicon substrate, an acoustic reflector on the silicon substrate, and a piezoelectric film on the acoustic reflector. IDT (interdigital transducer) electrodes are disposed on the piezoelectric film. The acoustic reflector is a mirror formed of alternately stacked high-elastic-impedance and low-elastic-impedance films. As an example of the combination of high-elastic-impedance and low-elastic-impedance films, the publication illustrates an acoustic reflector formed of alternately stacked tungsten and aluminum films.

The acoustic reflector of the elastic wave device disclosed in Japanese Unexamined Patent Application Publication No. 2008-530874 is formed of tungsten and aluminum films, i.e., metallic films. In this configuration, unfortunately, the poor temperature characteristics of the metals lead to poor frequency-temperature characteristics of the elastic device.

SUMMARY OF THE INVENTION

Preferred embodiments of the present invention provide an elastic wave device that offers good general characteristics and improved temperature characteristics.

An elastic wave device according to a preferred embodiment of the present invention includes a supporting substrate, an acoustic reflection layer on the supporting substrate, a piezoelectric layer on the acoustic reflection layer, and IDT electrode on an upper or lower surface of the piezoelectric layer. The piezoelectric layer is thinner than a period of fingers of the IDT electrode. Thus, the IDT electrode excites plate waves and the plate waves propagate. The acoustic reflection layer includes a low-acoustic-impedance layer and a high-acoustic-impedance layer having a higher acoustic impedance than an acoustic impedance of the low-acoustic-impedance layer. The low-acoustic-impedance layer is made of $SiO_2$, and the high-acoustic-impedance layer is made of at least one material selected from the group consisting of W, $LiTaO_3$, $Al_2O_3$, AlN, $LiNbO_3$, SiN, and ZnO.

In a particular aspect of the elastic wave device according to a preferred embodiment of the present invention, the high-impedance layer is made of at least one material selected from the group consisting of $LiTaO_3$, $Al_2O_3$, AlN, $LiNbO_3$, SiN, and ZnO.

In another particular aspect of the elastic wave device according to a preferred embodiment of the present invention, the piezoelectric layer is made of at least one material selected from the group consisting of $LiTaO_3$, $LiNbO_3$, ZnO, AlN, and quartz.

In yet another particular aspect of the elastic wave device according to a preferred embodiment of the present invention, the piezoelectric layer is made of $LiNbO_3$ or $LiTaO_3$, and Euler angles of the $LiNbO_3$ or $LiTaO_3$ fall within a range specified in Table 1 below when $A_1$, $S_0$, or $SH_0$ plate waves are used.

TABLE 1

| | Piezoelectric material | |
|---|---|---|
| Mode | $LiNbO_3$ | $LiTaO_3$ |
| $A_1$ | (0, 20, 0) to (0, 50, 0) | (0, 12, 0) to (0, 48, 0) |
| $S_0$ | (90, 90, 25) to (90, 90, 44) | (90, 90, 13) to (90, 90, 36) |
| $SH_0$ | (0, 95, 0) to (0, 132, 0) | (0, 100, 0) to (0, 134, 0) |

A method for manufacturing an elastic wave device according to yet another preferred embodiment of the present invention is one for an elastic wave device configured in accordance with other preferred embodiments of the present invention. This method includes forming the acoustic reflection layer on the supporting substrate, providing the piezoelectric layer on the acoustic reflection layer, and forming the IDT electrode on the piezoelectric layer.

In a particular aspect of the method for manufacturing an elastic wave device according to a preferred embodiment of the present invention, the piezoelectric layer is provided on the acoustic reflection layer by bonding a piezoelectric body onto the acoustic layer and making the piezoelectric body thinner in order to form into the piezoelectric layer.

In another particular aspect of the method for manufacturing an elastic wave device according to a preferred embodiment of the present invention, the piezoelectric layer is provided on the acoustic reflection layer by producing the piezoelectric layer in a form of film on the acoustic reflection layer. This allows a thin-film formation process such as vapor deposition or sputtering to be used to form a thin piezoelectric layer with ease and high accuracy.

Yet another particular aspect of the method for manufacturing an elastic wave device according to a preferred embodiment of the present invention includes forming the acoustic reflection layer on a piezoelectric body thicker than the piezoelectric layer, bonding the supporting substrate to a surface of the acoustic reflection layer opposite to a surface on which the piezoelectric body is disposed, making the piezoelectric body thinner to form into the piezoelectric layer, and forming the IDT electrode on the piezoelectric layer. In this configuration, the piezoelectric body can be made thinner in an easy and stable way because of the acoustic reflection layer and the supporting substrate stacked therebehind.

An elastic wave device according to a preferred embodiment of the present invention, which has, on the acoustic reflection layer thereof, a thin piezoelectric layer smaller in thickness than the period of the fingers of the IDT electrode and the low-acoustic-impedance layer of which is made of $SiO_2$ and the high-acoustic-impedance layer at least one material selected from the group consisting of W, $LiTaO_3$, $Al_2O_3$, AlN, $LiNbO_3$, SiN, and ZnO, exhibits a high impedance ratio of the high-acoustic-impedance layer to the low-acoustic-impedance layer. This makes the acoustic reflection layer effective in reflecting plate waves. As a result, the elastic wave device provides advantages such as good resonance characteristics and filter characteristics. This elastic wave device also has improved temperature characteristics because of the good temperature characteristics of $SiO_2$, the material for the low-acoustic-impedance layer, which is in contact with the piezoelectric layer.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 14 illustrates the relations of the ψ in Euler Angles (90°, 90°, ψ) to the band width ratio and the impedance ratio of a $LiNbO_3$ piezoelectric layer for $S_0$ plate waves in an elastic wave device according to Preferred Embodiment 1 of the present invention.

FIGS. 15A to 15D illustrate the propagation of $S_0$ Lamb waves, $S_1$ Lamb waves, $A_0$ Lamb waves, and $A_1$ Lamb waves, and FIGS. 15E and 15F illustrate the propagation of the $SH_0$ and $SH_1$ modes.

DETAILED DESCRIPTION OF THE PREFERRED EMBODIMENTS

The following describes specific preferred embodiments of the present invention with reference to the drawings to make the present invention more clearly understood.

Figure 1A:
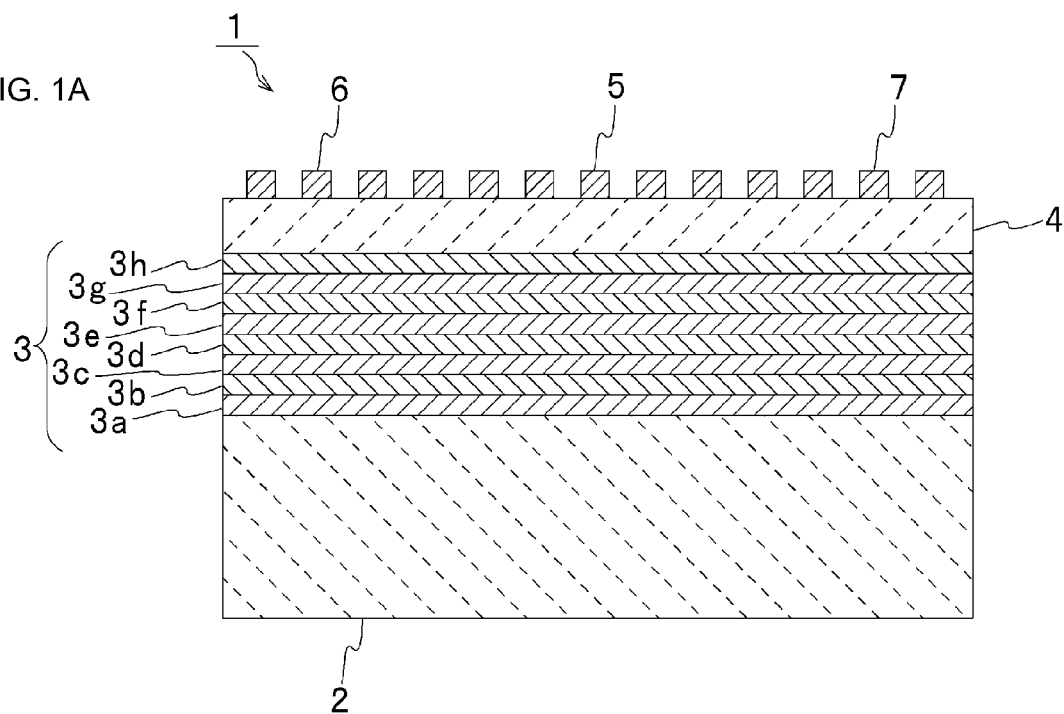
FIG. 1A is a front cross-sectional view of an elastic wave device according to Preferred Embodiment 1 of the present invention.
Figure 1B:
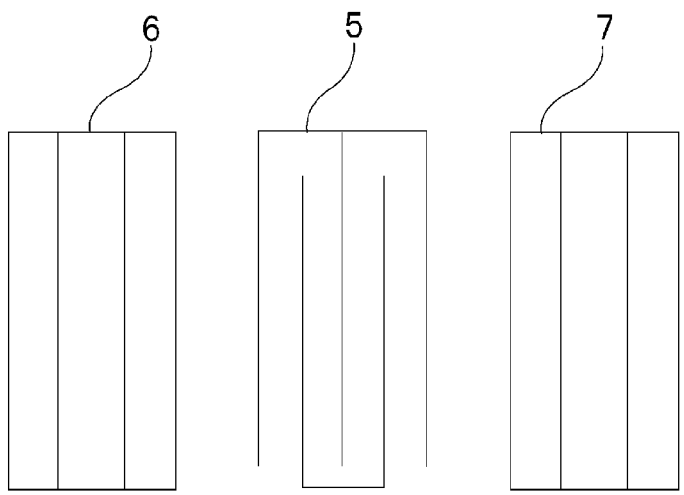
FIG. 1B is a schematic plan view illustrating the electrode structure of this device.

FIG. 1A is a front cross-sectional view of an elastic wave device according to Preferred Embodiment 1 of the present invention, and FIG. 1B is a schematic plan view illustrating the electrode structure of this device.

An elastic wave device 1 preferably uses plate waves. The elastic wave device 1 includes a supporting substrate 2. The supporting substrate 2 is preferably made of $LiNbO_3$. The supporting substrate 2 can be made of any material; examples include ceramics, $LiTaO_3$, quartz, Si, glass, and other suitable substances.

The supporting substrate 2 includes an acoustic reflection layer 3 on top. The acoustic reflection layer 3, in this preferred embodiment, includes high-acoustic-impedance layers 3a, 3c, 3e, and 3g and low-acoustic-impedance layers 3b, 3d, 3f, and 3h. The acoustic impedance of the high-acoustic-impedance layers 3a, 3c, 3e, and 3g is higher than that of the low-acoustic-impedance layers 3b, 3d, 3f, and 3h. In this preferred embodiment, the high-acoustic-impedance layers 3a, 3c, 3e, and 3g and the low-acoustic-impedance layers 3b, 3d, 3f, and 3h alternate in the stacking direction.

In this preferred embodiment, the high-acoustic-impedance layers 3a, 3c, 3e, and 3g are preferably made of AlN, and the low-acoustic-impedance layers 3b, 3d, 3f, and 3h are preferably made of $SiO_2$, for example.

In the acoustic reflection layer 3, which is a stack of the alternating high-acoustic-impedance layers 3a, 3c, 3e, and 3g and low-acoustic-impedance layers 3b, 3d, 3f, and 3h, plate waves propagating down are to be reflected at the lower surfaces of the low-acoustic-impedance layers 3b, 3d, 3f, and 3h, i.e., the interfaces between the high-acoustic-impedance layers 3a, 3c, 3e, and 3g and the low-acoustic-impedance layers 3b, 3d, 3f, and 3h.

A piezoelectric layer 4 is on the upper surface of the acoustic reflection layer 3. The piezoelectric layer 4 can be made of any suitable piezoelectric material. In this preferred embodiment, $LiNbO_3$ is preferably used, for example.

Preferably, the piezoelectric layer 4 is made of one material selected from the group consisting of $LiTaO_3$, $LiNbO_3$, ZnO, AlN, and quartz. Such piezoelectric materials are commonly used in elastic wave devices and similar devices and are easily available. Such piezoelectric materials are effective in exciting plate waves when used in accordance with various preferred embodiments of the present invention. The piezoelectric material for the piezoelectric layer 4 can be of any suitable one with a required band width and a sufficiently high electromechanical coupling coefficient.

The piezoelectric layer 4 includes IDT electrode 5 and reflectors 6 and 7, or in other words a one-port elastic wave resonator, on top. The IDT electrode 5 and the reflectors 6 and 7 are preferably made of Al. However, all electrode materials can be used, including Al, Cu, Pt, Au, Ti, Ni, Cr, Ag, W, Mo, Ta, and other suitable metals or alloys. A laminate formed of layers of such metals can also be used.

The thickness of the piezoelectric layer 4 is smaller than the period of the fingers of the IDT electrode 5. For example, if the elastic wave device 1 has a resonance point at 5 GHz, the period of the electrode fingers preferably is approximately 3 μm. The piezoelectric layer 4 is therefore thinner than approximately 3 μm in this case. In this preferred embodiment, for example, the piezoelectric layer 4 is very thin at approximately 0.4 μm.

The elastic wave device 1 according to this preferred embodiment, in which the piezoelectric layer 4 is very thin as described above, efficiently excites plate waves and propagates the excited waves in the piezoelectric layer 4 when an alternating electric field is applied to the IDT electrode 5. Furthermore, this device includes the acoustic reflection layer 3, and plate waves leaking on the acoustic reflection layer 3 side are reflected by the acoustic reflection layer 3. The plate waves propagating in the piezoelectric layer 4 therefore have a high energy intensity.

The IDT electrode 5 may have coatings such as a temperature compensation film, a protection film, or a frequency adjustment film. Such a temperature compensation film, a protection film, or a frequency adjustment film can be made of any suitable material, and examples include insulating films made of $SiO_2$, SiN, $Al_2O_3$, or a similar substance.

In the first aspect of a preferred embodiment of the present invention, the low-acoustic-impedance layer is preferably made of $SiO_2$, and the high-acoustic-impedance layer is preferably made of at least one material selected from the group consisting of W, $LiTaO_3$, $Al_2O_3$, AlN, $LiNbO_3$, SiN, and ZnO. Such a combination of low-acoustic-impedance and high-acoustic-impedance layers leads to a high ratio of the acoustic impedance of the high-acoustic-impedance layer to that of the low-acoustic-impedance layer, i.e., a high acoustic impedance ratio. As a result, the acoustic reflection layer can effectively reflect plate waves, and the elastic wave device provides advantages such as good resonance characteristics and filter characteristics. The following describes in detail how such advantages are achieved with reference to a non-limiting experimental example.

An elastic wave device 1 according to the above preferred embodiment was fabricated in accordance with the specifications in Table 2 below.

TABLE 2

|  |  | Material | Thickness | Euler Angles |
|---|---|---|---|---|
|  | Electrodes | Al | 0.03 λ | (0, 0, 0) |
|  | Piezoelectric layer | $LiNbO_3$ | 0.15 λ | (0, 0, 0) |
| Acoustic | Low-impedance layers | $SiO_2$ | 0.075 λ | (0, 0, 0) |
| reflection layer | High-impedance layers | AlN | 0.165 λ | (0, 0, 0) |
|  | Supporting substrate | $LiNbO_3$ | 10 λ | (0, 0, 0) |

The total number of stacked high-acoustic-impedance and low-acoustic-impedance layers, which is eight in FIG. 1A, was ten in this non-limiting experimental example.

Figure 2:
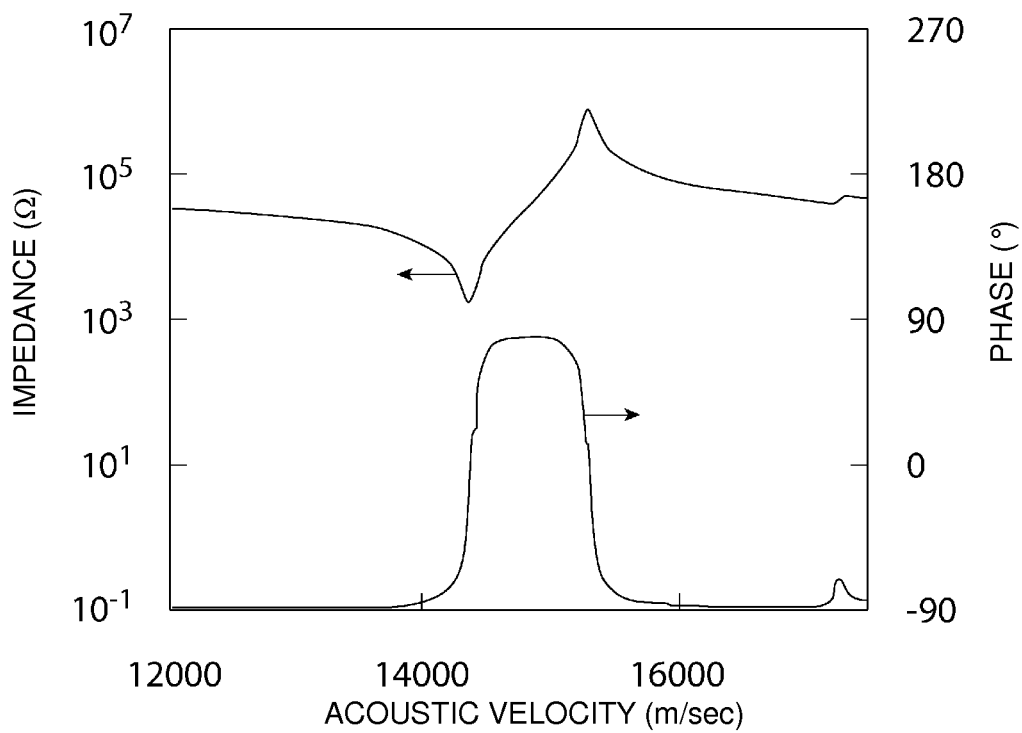
FIG. 2 illustrates the impedance characteristics and phase characteristics of an elastic wave device according to a preferred embodiment of the present invention.

FIG. 2 illustrates the impedance characteristics and phase characteristics of the elastic wave device according to the above preferred embodiment.

Figure 3:
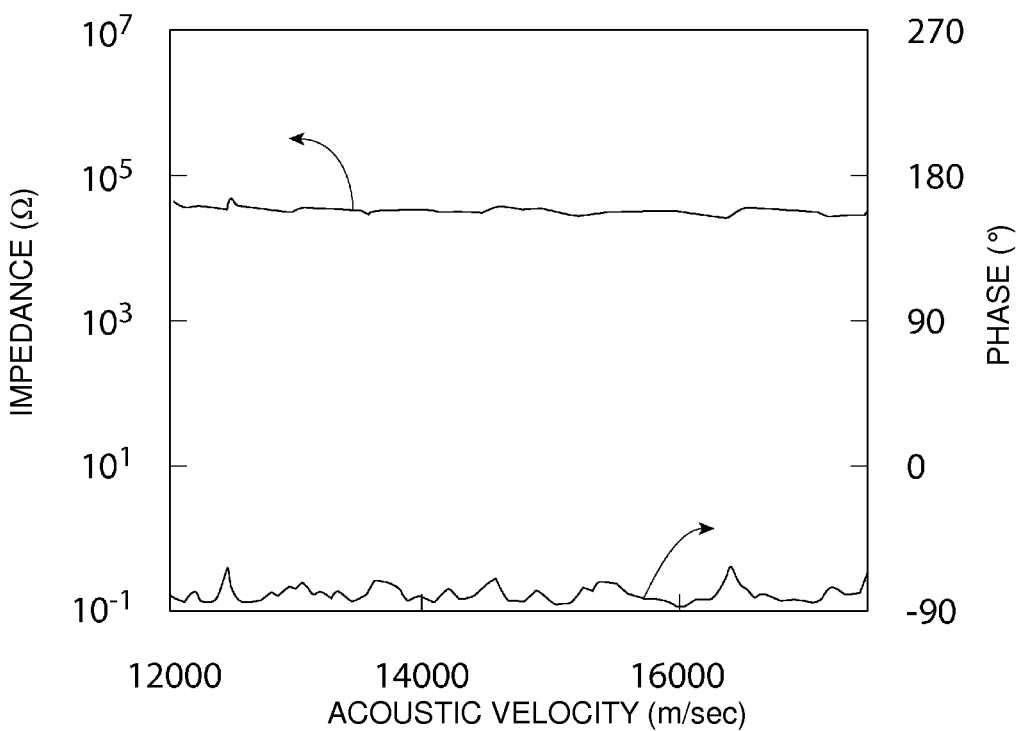
FIG. 3 illustrates the impedance characteristics and phase characteristics of an elastic wave device according to a comparative example that does not contain an acoustic reflection layer.

For comparison, an elastic wave device of Comparative Example 1 was prepared in the same way as the above one except that no acoustic reflection layer was formed. FIG. 3 illustrates the impedance characteristics and phase characteristics of this elastic wave device of Comparative Example 1.

Figure 4:
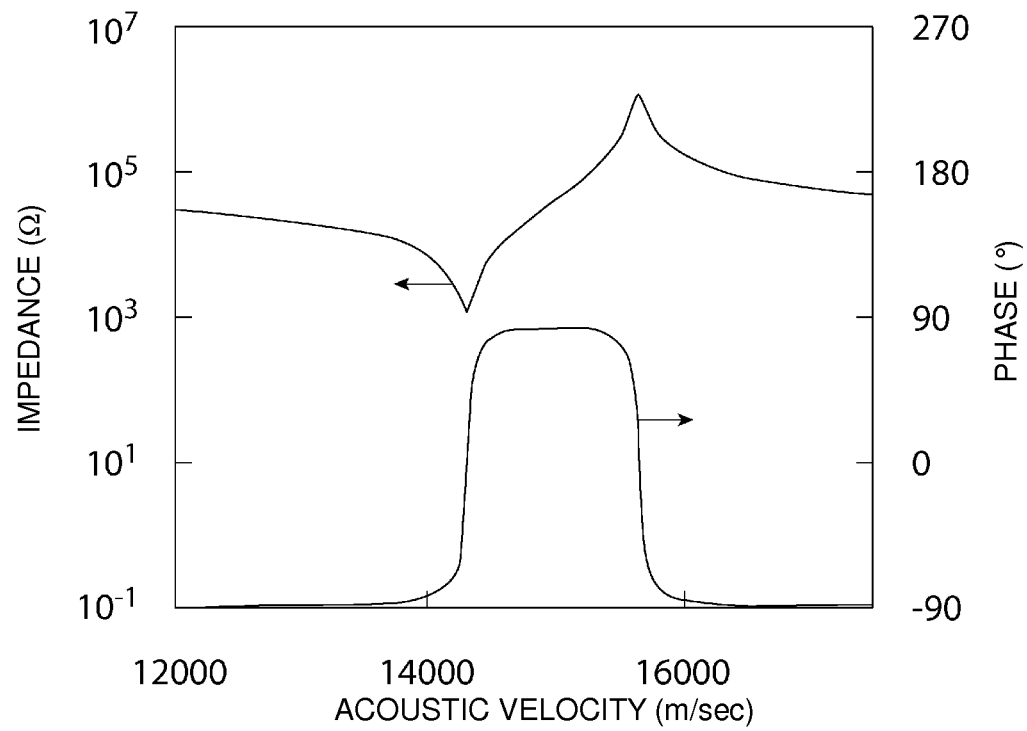
FIG. 4 illustrates the impedance characteristics and phase characteristics of an elastic wave device prepared for comparison that does not contain an acoustic reflection layer but has a cavity instead.

An elastic wave device of Comparative Example 2 was also prepared. This device was made using the same materials as the experimental example of the above preferred embodiment, but had no acoustic reflection layer and had a cavity formed by a depression in the supporting substrate instead. FIG. 4 illustrates the impedance characteristics and phase characteristics of this elastic wave device of Comparative Example 2.

As is clear from a comparison of FIGS. 2 and 4, the above preferred embodiment achieves good resonance characteristics for $A_1$ Lamb waves, a mode of plate waves, despite the absence of a cavity. Furthermore, as is clear from a comparison of FIGS. 2 and 3, the device having no acoustic reflection layer showed little response to plate waves. These results indicate that the presence of the acoustic reflection layer 3 makes this preferred embodiment, having no cavity, able to achieve good resonance characteristics for $A_1$ Lamb waves like Comparative Example 2, which had a cavity, as illustrated in FIG. 2.

Incidentally, plate waves are classified by the displacement components thereof into Lamb waves (the components in the propagation direction of the elastic waves and in the direction of the thickness of the piezoelectric body are predominant) and SH waves (the SH component is predominant). Lamb waves are further categorized into symmetric (S) and anti-symmetric (A) modes. When the shape of displacement is folded along a horizontal line dividing the thickness of the piezoelectric body in half, the wave mode is called symmetric if the upper and lower halves completely match, or anti-symmetric if the displacement is in opposite directions in the two halves. A subscript number represents the number of nodes in the thickness direction. A1 Lamb waves are therefore first-order anti-symmetric Lamb waves. FIGS. 15A-15F illustrate the propagation of these S and A Lamb wave modes and SH wave modes. The directions of displacement of the elastic waves are indicated by arrows in FIGS. 15A to 15D and correspond to the directions of the thickness of the sheet of paper in 15E and 15F.

The higher the ratio of the acoustic impedance of the high-acoustic-impedance layers 3a, 3c, 3e, and 3g to that of the low-acoustic-impedance layers 3b, 3d, 3f, and 3h is, i.e., the higher the acoustic impedance ratio is, the more effectively the acoustic reflection layer 3 can reflect elastic waves. Table 3 below lists some materials for acoustic impedance layers with the density, the acoustic velocity for $A_1$ Lamb waves, and the acoustic impedance thereof.

TABLE 3

|  |  | Density (g/cm³) | Acoustic velocity (m/sec) | Acoustic impedance (×10⁹ g/m²/sec) |
|---|---|---|---|---|
| [h1]impedance layer material | $SiO_2$ | 2.2 | 14126 | 31 |
|  | ZnO | 5.7 | 11031 | 62 |
|  | SiN | 3.2 | 22517 | 72 |
|  | $LiNbO_3$ | 4.6 | 15891 | 74 |
|  | AlN | 3.3 | 22974 | 75 |
|  | $Al_2O_3$ | 4.0 | 23366 | 93 |
|  | $LiTaO_3$ | 7.5 | 14237 | 106 |
|  | W | 19.3 | 10926 | 210 |

From Table 3, the acoustic impedance ratio can be determined for each combination of these materials as shown in Table 4 below.

TABLE 4

| Acoustic impedance ratio | | High-acoustic-impedance layer material | | | | | | | |
|---|---|---|---|---|---|---|---|---|---|
| | | $SiO_2$ | ZnO | SiN | $LiNbO_3$ | AlN | $Al_2O_3$ | $LiTaO_3$ | W |
| Low-acoustic-impedance layer material | $SiO_2$ | 1 | 2 | 2.3 | 2.4 | 2.4 | 3 | 3.4 | 6.8 |
| | ZnO | — | 1 | 1.2 | 1.2 | 1.2 | 1.5 | 1.7 | 3.4 |
| | SiN | — | — | 1 | 1 | 1 | 1.3 | 1.5 | 2.9 |
| | $LiNbO_3$ | — | — | — | 1 | 1 | 1.3 | 1.4 | 2.9 |
| | AlN | — | — | — | — | 1 | 1.2 | 1.4 | 2.8 |
| | $Al_2O_3$ | — | — | — | — | — | 1 | 1.1 | 2.3 |
| | $LiTaO_3$ | — | — | — | — | — | — | 1 | 2 |
| | W | — | — | — | — | — | — | — | 1 |

FIGS. 5 to 8 illustrate the impedance characteristics and phase characteristics of elastic wave devices according to the above preferred embodiment. The acoustic reflection layer 3 of these elastic wave devices was formed using different materials and different total numbers of stacked low-acoustic-impedance and high-acoustic-impedance layers. These devices were fabricated in the same way as the aforementioned experiment example of Preferred Embodiment 1 except for the constitution of the acoustic reflection layer.

Figure 5:
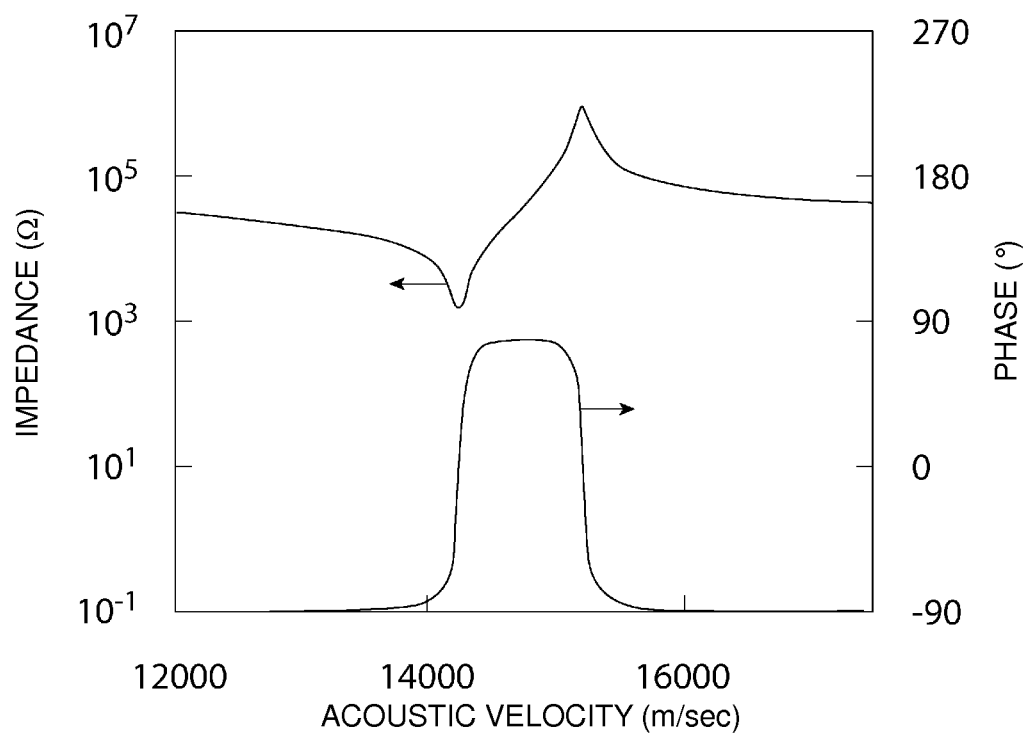
FIG. 5 illustrates the impedance characteristics and phase characteristics of an elastic wave device according to Preferred Embodiment 1 of the present invention. The acoustic reflection layer of this device includes six alternately stacked low-acoustic-impedance layers made of $SiO_2$ and high-acoustic-impedance layers made of W.

FIG. 5 presents the results for a device in which the acoustic reflection layer 3 was a stack of three low-acoustic-impedance layers made of $SiO_2$ alternating with three high-acoustic-impedance layers made of W.

Figure 6:
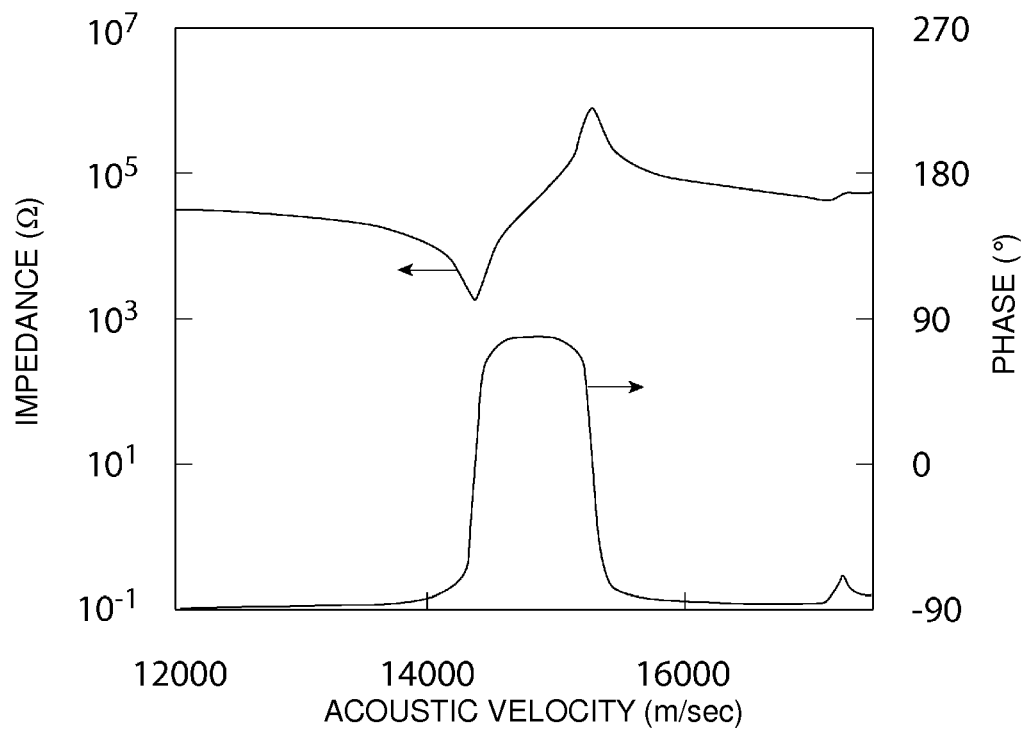
FIG. 6 illustrates the impedance characteristics and phase characteristics of an elastic wave device according to Preferred Embodiment 1 of the present invention. The acoustic reflection layer of this device includes ten alternately stacked low-acoustic-impedance layers made of $SiO_2$ and high-acoustic-impedance layers made of AlN.

FIG. 6 shows the results obtained using an acoustic reflection layer in which five low-acoustic-impedance layers made of $SiO_2$ alternating with five high-acoustic-impedance layers made of AlN.

Figure 7:
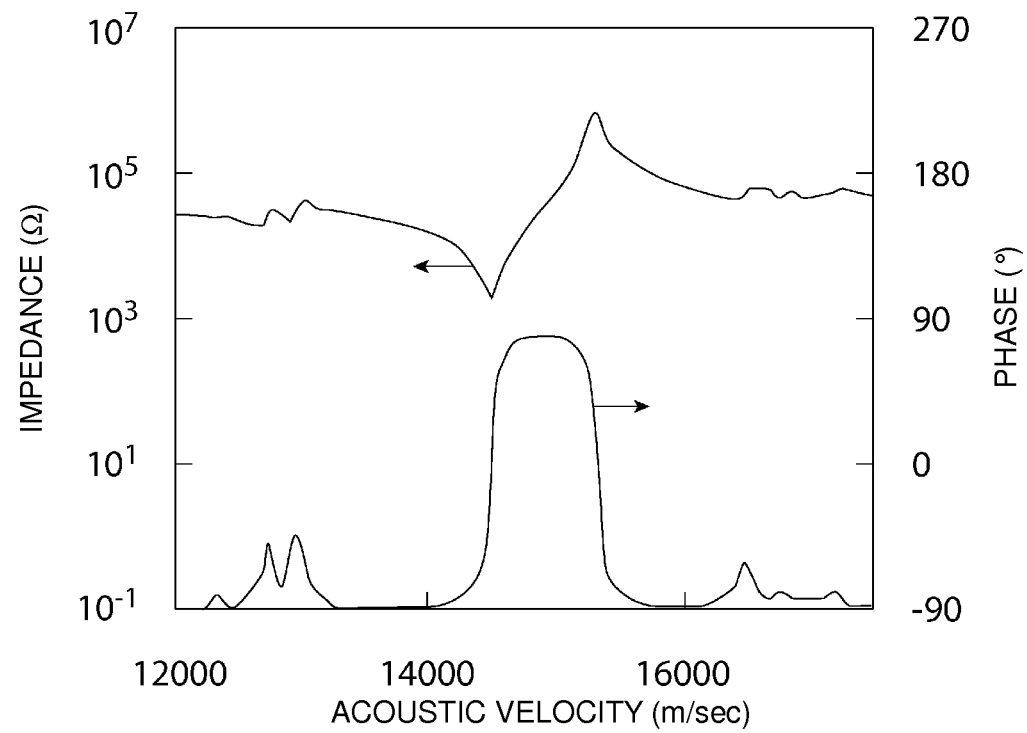
FIG. 7 illustrates the impedance characteristics and phase characteristics of an elastic wave device according to Preferred Embodiment 1 of the present invention. The acoustic reflection layer of this device includes 14 alternately stacked low-acoustic-impedance layers made of $SiO_2$ and high-acoustic-impedance layers made of ZnO.

FIG. 7 shows the results obtained using an acoustic reflection layer in which seven low-acoustic-impedance layers made of $SiO_2$ alternating with seven high-acoustic-impedance layers made of ZnO.

Figure 8:
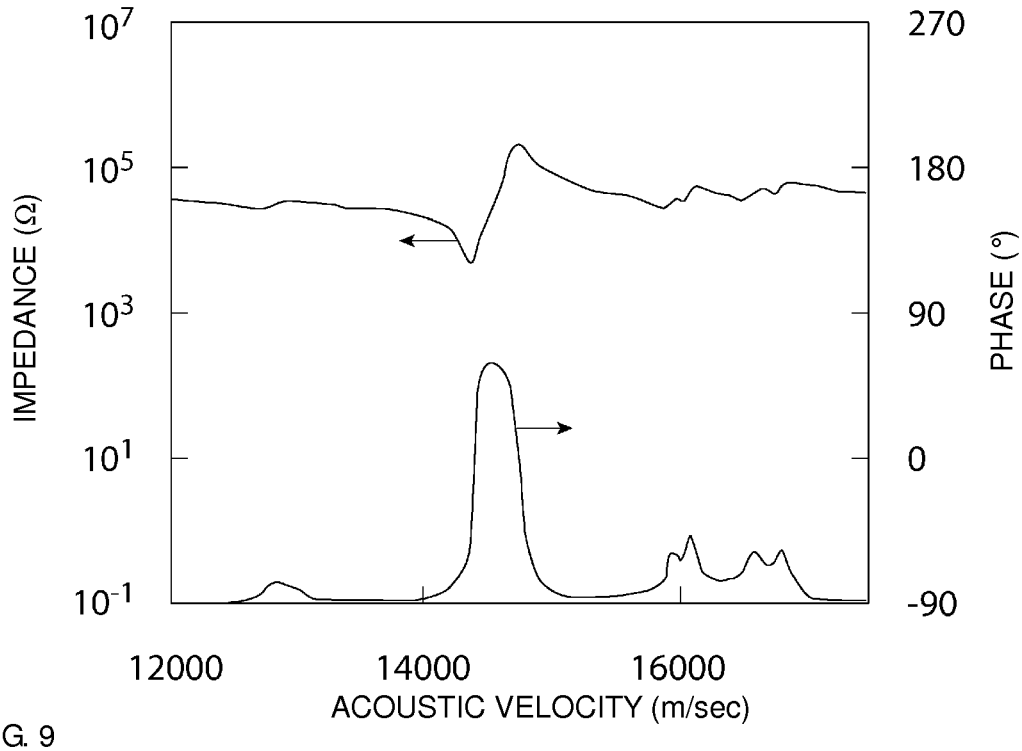
FIG. 8 illustrates the impedance characteristics and phase characteristics of an elastic wave device according to Preferred Embodiment 1 of the present invention. The acoustic reflection layer of this device includes 20 alternately stacked low-acoustic-impedance layers made of ZnO and high-acoustic-impedance layers made of $LiTaO_3$.

FIG. 8 gives the results for a device containing an acoustic reflection layer having ten low-acoustic-impedance layers made of ZnO and ten $LiTaO_3$ layers.

Table 5 below summarizes the impedance ratio and the band width ratio of resonators determined from the impedance characteristics and phase characteristics illustrated in FIGS. 5 to 8. The term "impedance ratio of a resonator" refers to the ratio of the impedance of the resonator at the anti-resonant frequency to that at the resonant frequency, or the "peak-to-valley ratio."

The values marked with *1 in Table 5 are in the form of the thickness of the low-acoustic-impedance layers/the thickness of the high-acoustic-impedance layers. The term "band width ratio", as used herein, is defined as the proportion of the difference between the anti-resonant frequency and the resonant frequency to the resonant frequency.

As is clear from FIGS. 5 to 8 and Table 5, the combination of $LiTaO_3$ and ZnO, for which the impedance ratio is 1.70, resulted in an impedance ratio and a band width ratio as small as 33.2 dB and 2.5%, respectively, whereas the combinations that give an acoustic impedance ratio of 6.77, 2.41, or 2.01 resulted in improved resonance characteristics, an impedance ratio higher than 50 dB or more and a band width ratio of 5.7% or more. This appears to be because the high acoustic impedance ratio, as high as 2.01 or more, allowed the acoustic reflection layer 3 to effectively reflect $A_1$ Lamb waves. This effective way of reflecting plate waves provides an elastic wave device having good resonance characteristics and filter characteristics.

As can be seen from the foregoing, the acoustic reflection layer can effectively reflect $A_1$ Lamb waves when the ratio of the acoustic impedance of the high-acoustic-impedance layers to that of the low-acoustic-impedance layers is as high as 2.0 or more. Besides $A_1$ Lamb waves, an acoustic reflection layer configured in such a way is also effective in reflecting $S_0$ Lamb waves and $SH_0$ Lamb waves.

The best combinations of materials, which make the acoustic impedance ratio 2.0 or more as described above, can be obtained by using the combination specified in the aforementioned first aspect of a preferred embodiment of the present invention, i.e., $SiO_2$ for the low-acoustic-impedance layer combined with at least one material selected from the group consisting of W, $LiTaO_3$, $Al_2O_3$, AlN, $LiNbO_3$, SiN, and ZnO for the high-acoustic-impedance layer. The acous-

TABLE 5

| Acoustic reflection layer materials | Acoustic impedance ratio | Reflection layer thickness*1 | Total number of acoustic impedance layers | Resonance characteristics | |
|---|---|---|---|---|---|
| | | | | Impedance ratio | Band width ratio |
| $SiO_2$/W | 6.77 | 0.075 λ/ 0.050 λ | 6 | 54.8 dB | 6.80% |
| $SiO_2$/AlN | 2.41 | 0.075 λ/ 0.165 λ | 10 | 53.3 dB | 6.50% |
| $SiO_2$/ZnO | 2.01 | 0.070 λ/ 0.070 λ | 14 | 50.1 dB | 5.70% |
| ZnO/$LiTaO_3$ | 1.7 | 0.070 λ/ 0.080 λ | 20 | 33.2 dB | 2.50% | tic impedance values of these materials for acoustic impedance are as shown in Table 3 above.

It is not always necessary that the high-acoustic-impedance layers be made of a single material; these layers may be composed of two or more of the listed materials. More specifically, it is both possible to form the high-acoustic-impedance layers from a mixture of two or more of the materials included in the aforementioned combination and to stack some high-acoustic-impedance layers made of different materials.

In a configuration where the reflection layer contains a metal, it is preferable to pattern the reflection layer since the metal contained in the relevant material for the reflection layer and routing electrodes can form stray capacitance therebetween that may affect the characteristics of the elastic wave device. However, using a combination of $SiO_2$ for the low-acoustic-impedance layers and at least one material selected from the group consisting of $LiTaO_3$, $Al_2O_3$, AlN, $LiNbO_3$, SiN, and ZnO for the high-acoustic-impedance layers as in the second aspect of a preferred embodiment of the present invention in this preferred embodiment eliminates the necessity of patterning the reflection layer because in this configuration no metals are contained in the materials for the reflection layer. Patterning of the reflection layer can therefore be omitted so as to reduce the manufacturing cost.

latter configuration is effective in improving the frequency-temperature characteristics of an elastic wave device.

Figure 9:
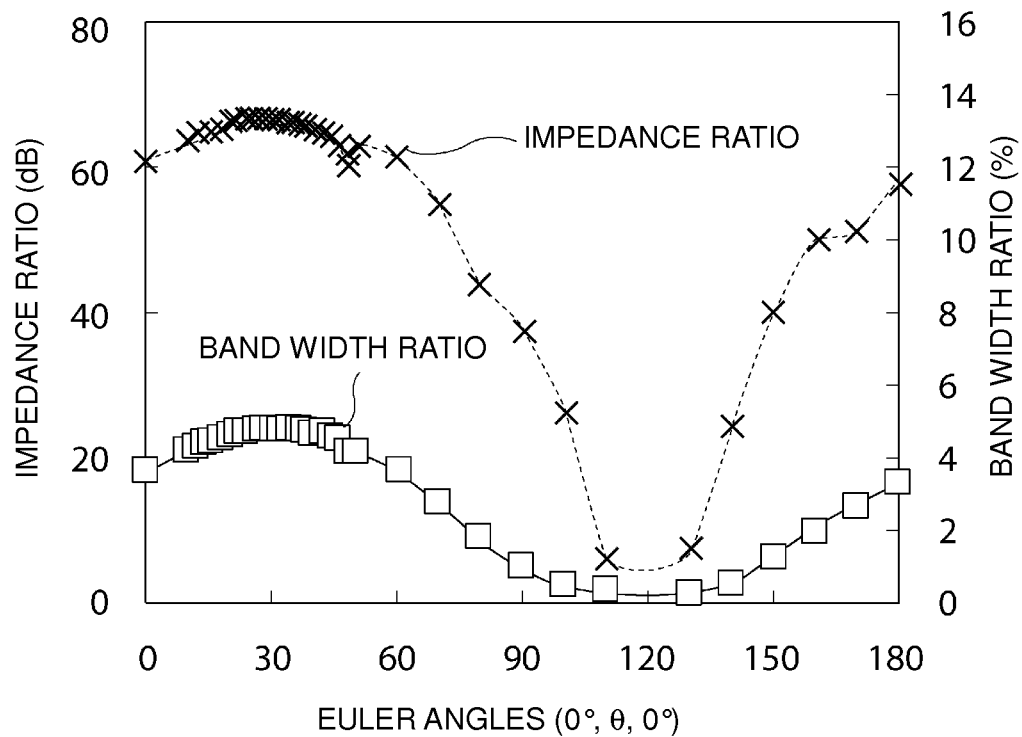
FIG. 9 illustrates the relations of the θ in Euler Angles (0°, θ, 0°) to the band width ratio and the impedance ratio of a $LiTaO_3$ piezoelectric layer for $A_1$ plate waves in an elastic wave device according to Preferred Embodiment 1 of the present invention.
Figure 10:
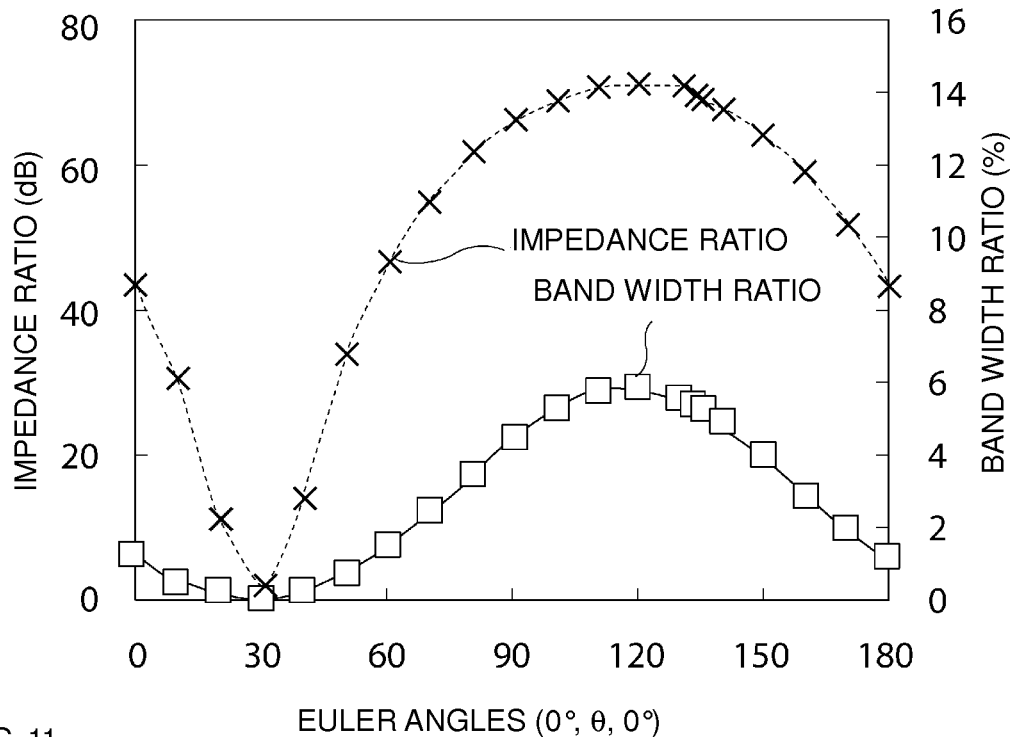
FIG. 10 illustrates the relations of the θ in Euler Angles (0°, θ, 0°) to the band width ratio and the impedance ratio of a $LiTaO_3$ piezoelectric layer for $SH_0$ plate waves in an elastic wave device according to Preferred Embodiment 1 of the present invention.
Figure 11:
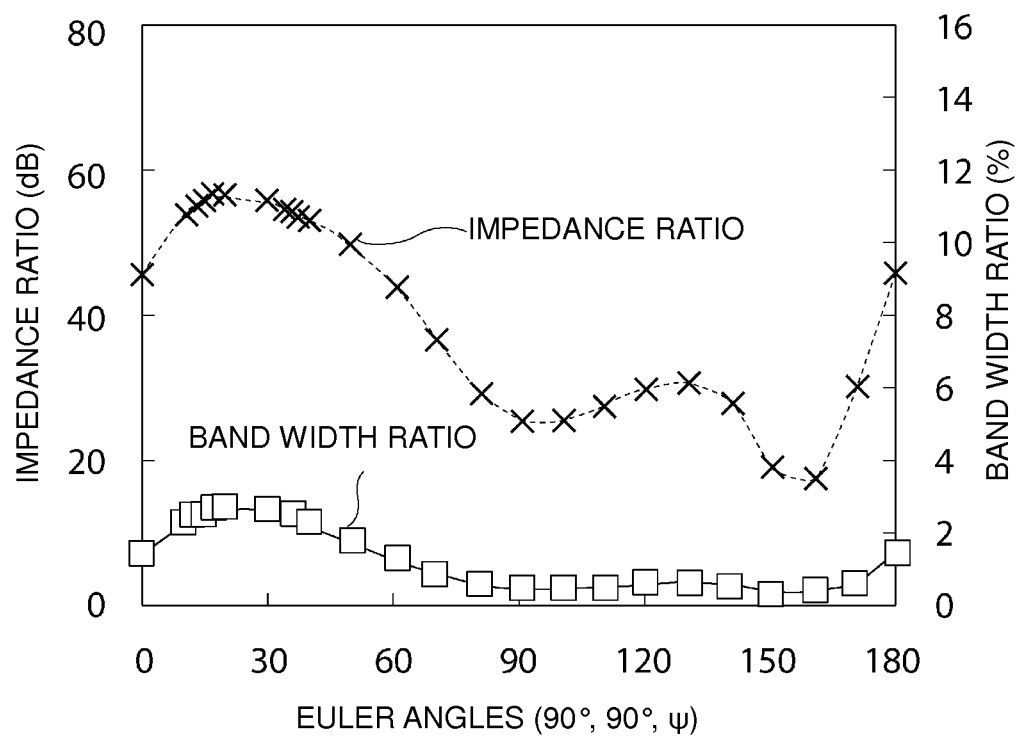
FIG. 11 illustrates the relations of the ψ in Euler Angles (90°, 90°, ψ) to the band width ratio and the impedance ratio of a $LiTaO_3$ piezoelectric layer for $S_0$ plate waves in an elastic wave device according to Preferred Embodiment 1 of the present invention.

The impedance ratio and band width ratio BW described above, which are measures of resonance characteristics, were then determined for different sets of Euler Angles of the piezoelectric layer 4, with $LiTaO_3$ used in the piezoelectric layer 4. The results are shown in FIGS. 9 to 11. FIGS. 9, 10, and 11 present the results for $A_1$, $SH_0$, and $S_0$ Lamb waves, respectively.

Figure 12:
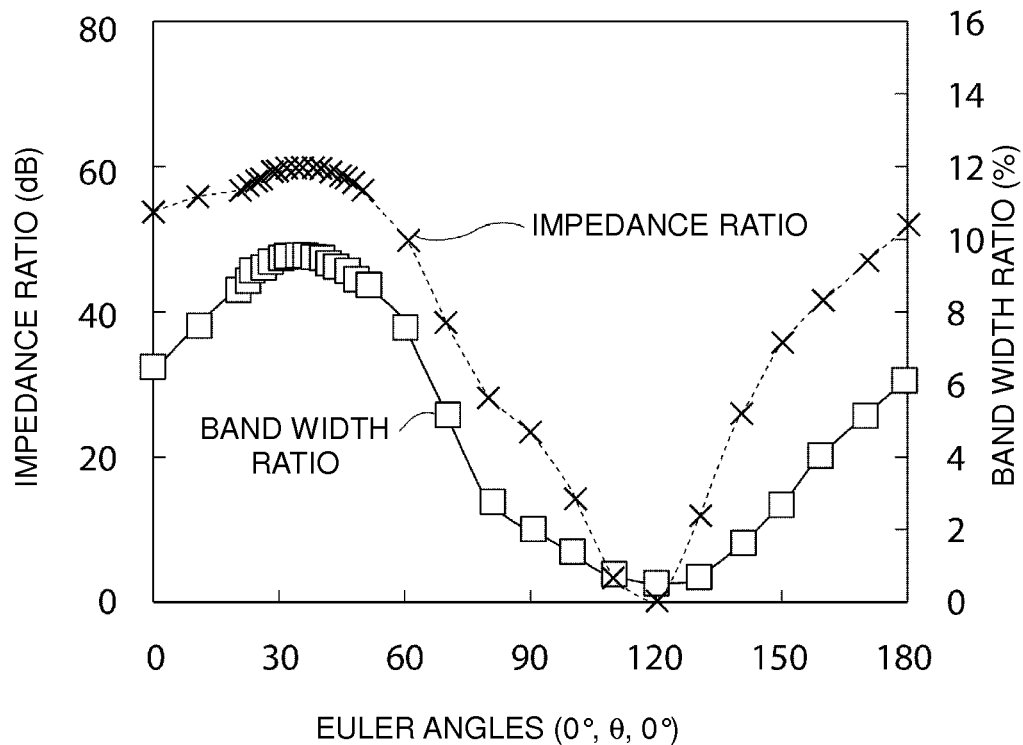
FIG. 12 illustrates the relations of the θ in Euler Angles (0°, θ, 0°) to the band width ratio and the impedance ratio of a $LiNbO_3$ piezoelectric layer for $A_1$ plate waves in an elastic wave device according to Preferred Embodiment 1 of the present invention.
Figure 13:
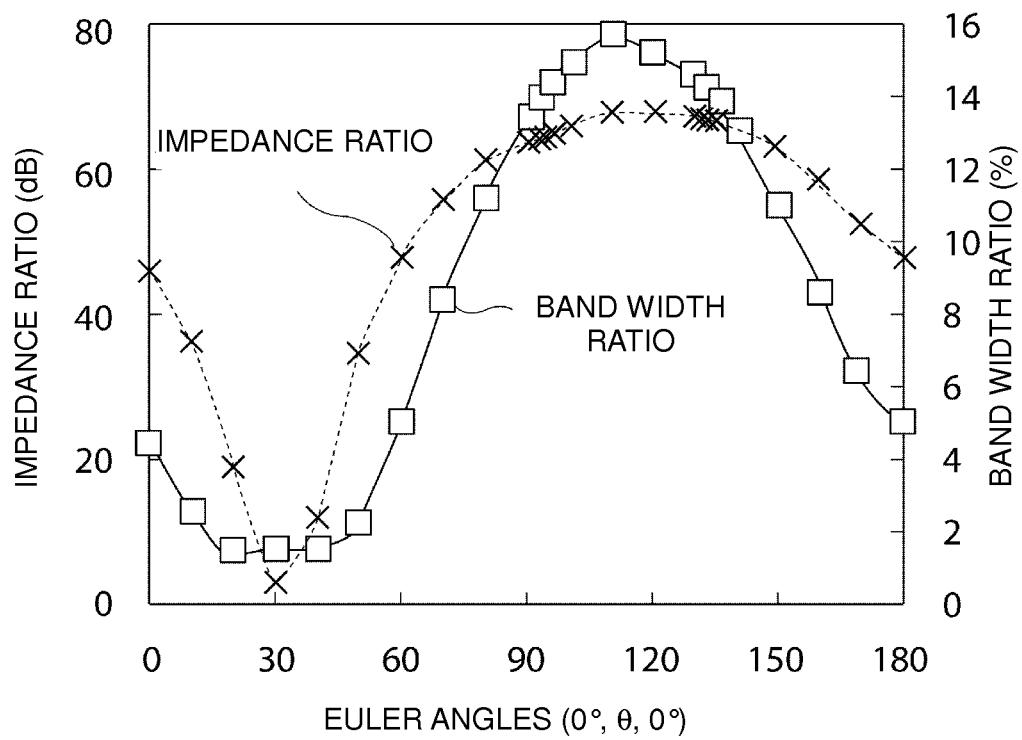
FIG. 13 illustrates the relations of the θ in Euler Angles (0°, θ, 0°) to the band width ratio and the impedance ratio of a $LiNbO_3$ piezoelectric layer for $SH_0$ plate waves in an elastic wave device according to Preferred Embodiment 1 of the present invention.

The relations of Euler Angles to the impedance ratio and the band width ratio as measures of resonance characteristics were then determined in the same way, with the piezoelectric layer 4 made of $LiNbO_3$. The results are shown in FIGS. 12 to 14. FIG. 12 presents the results for $A_1$ Lamb waves, FIG. 13 the results for $SH_0$ Lamb waves, and FIG. 14 the results for $S_0$ Lamb waves.

In FIGS. 9 and 10 and FIGS. 12 and 13, the θ in Euler Angles (0°, θ, 0°) were varied. In FIGS. 11 and 14, the ψ in Euler Angles (90, 90, ψ) were varied.

A more detailed description is as follows. Elastic wave devices according to the above preferred embodiment were fabricated in accordance with the specifications in Table 6 below. The relations of the Euler Angle θ or ψ of the piezoelectric layer 4 to the impedance ratio and the band width ratio as measures of resonance characteristics were determined with varying Euler Angles θ or ψ.

TABLE 6

| | | | Piezoelectric material | | | | | |
|---|---|---|---|---|---|---|---|---|
| | | | $LiNbO_3$ | | | $LiTaO_3$ | | |
| | Mode | | $A_1$ | $S_0$ | $SH_0$ | $A_1$ | $S_0$ | $SH_0$ |
| Electrodes | Material | | Al | Al | Al | Al | Al | Al |
| | Thickness | | 0.03 λ | 0.05 λ | 0.07 λ | 0.02 λ | 0.05 λ | 0.07 λ |
| Piezoelectric layer | Material | | $LiNbO_3$ | $LiNbO_3$ | $LiNbO_3$ | $LiTaO_3$ | $LiTaO_3$ | $LiTaO_3$ |
| | Thickness | | 0.15 λ | 0.10 λ | 0.10 λ | 0.10 λ | 0.10 λ | 0.10 λ |
| | Euler Angles | | (0, θ, 0) | (90, 90, ψ) | (0, θ, 0) | (0, θ, 0) | (90, 90, ψ) | (0, θ, 0) |
| Reflection layer | Reflection layer (low-impedance layers) | Material | $SiO_2$ | $SiO_2$ | $SiO_2$ | $SiO_2$ | $SiO_2$ | $SiO_2$ |
| | | Thickness | 0.075 λ | 0.06 λ | 0.2 λ | 0.054 λ | 0.45 λ | 0.24 λ |
| | Reflection layer (high-impedance layers) | Material | AlN | AlN | AlN | AlN | AlN | AlN |
| | | Thickness | 0.165 λ | 0.10 λ | 0.4 λ | 0.108 λ | 0.45 λ | 0.6 λ |
| | Number of layers | | 10 | 6 | 6 | 10 | 10 | 6 |
| Supporting substrate | Material | | Si | Si | Si | Si | Si | Si |
| | Thickness | | 10 λ | 10 λ | 10 λ | 10 λ | 10 λ | 10 λ |

The following demonstrates how much frequency-temperature characteristics can be improved by using $SiO_2$ in low-acoustic-impedance layers. In Japanese Unexamined Patent Application Publication No. 2008-530874, aluminum is used in low-acoustic-impedance layers, and W in high-acoustic-impedance layers. In a preferred embodiment of the present invention, $SiO_2$ is used in low-acoustic-impedance layers, and W in high-acoustic-impedance layers. The frequency-temperature characteristics in both of these configurations were determined under the same conditions except for the above difference. In the former the results were −114 ppm/° C. at the resonance point and −107 ppm/° C. at the anti-resonance point, whereas in the latter, a preferred embodiment of the present invention, the results were greatly improved, −62 ppm/° C. at the resonance point and −42 ppm/° C. at the anti-resonance point. The material for the reflection layer that comes in direct contact with the piezoelectric layer is aluminum in the former, and $SiO_2$ in the latter. The temperature coefficient of the elastic constant of aluminum is of the same sign as those of piezoelectric substances such as $LiNbO_3$, making the former configuration ineffective in improving the frequency-temperature characteristics of an elastic wave device. With regard to $SiO_2$, this temperature coefficient is of the opposite sign to those of piezoelectric substances such as $LiNbO_3$; thus, the As is clear from FIGS. 9 to 11 and FIGS. 12 to 14, when $LiTaO_3$ or $LiNbO_3$ is used, a set of Euler Angles falling within the range specified for the particular mode in Table 7 below makes the impedance ratio within the range of X−0.1 to X, where X is the highest impedance ratio. In other words, such a set of Euler Angles provides an elastic wave device having a good impedance ratio range in which the impedance ratio varies from the optimum ratio to the ratio lower than the optimum one by 10%. The characteristics of such a device are nearly optimal and satisfactory for practical applications.

TABLE 7

| | Piezoelectric material | |
|---|---|---|
| Mode | $LiNbO_3$ | $LiTaO_3$ |
| $A_1$ | (0, 20, 0) to (0, 50, 0) | (0, 12, 0) to (0, 48, 0) |
| $S_0$ | (90, 90, 25) to (90, 90, 44) | (90, 90, 13) to (90, 90, 36) |
| $SH_0$ | (0, 95, 0) to (0, 132, 0) | (0, 100, 0) to (0, 134, 0) |

Elastic wave devices according to various preferred embodiments of the present invention can be manufactured by any method. However, it is preferred to use manufacturing methods according to Preferred Embodiments 2 to 4 below.

A method for manufacturing an elastic wave device according to Preferred Embodiment 2 starts with preparing the supporting substrate 2. The acoustic reflection layer 3 is then formed on the supporting substrate 2 by a thin-film formation process such as CVD, sputtering, or vapor deposition. The supporting substrate 2 having the acoustic reflection layer 3 on top and a piezoelectric body thicker than the piezoelectric layer 4 are then stuck together by bonding or a similar process. This sticking operation is followed by making the piezoelectric body thinner by polishing, etching, or any other appropriate process to form into the piezoelectric layer 4. After the piezoelectric layer 4 is provided in such a way, the IDT electrode 5 is formed on the piezoelectric layer 4.

The piezoelectric body can be a single-crystal one so that the piezoelectric layer 4 can have high crystallinity. This improves the resonance characteristics of the elastic wave device 1. It is also possible to provide a bonding layer made of $SiO_2$ or a similar material between the piezoelectric layer 4 and the acoustic reflection layer 3.

A manufacturing method according to Preferred Embodiment 3 starts with preparing a piezoelectric body thicker than the piezoelectric layer 4. The acoustic reflection layer 3 is then formed on the piezoelectric body by a thin-film formation process such as CVD, sputtering, or vapor deposition. The piezoelectric body having the acoustic reflection layer 3 on either side thereof and the supporting substrate 2 are then bonded together by bonding the substrate to the acoustic reflection layer 3 directly or via a bonding material. The piezoelectric body is then processed and made thinner by polishing, etching, or any other appropriate process to form into the piezoelectric layer 4. Finally, the IDT electrode 5 is formed on the piezoelectric layer 4.

In this case it is also possible to obtain an elastic wave device 1 with high crystallinity since the piezoelectric body can be a single-crystal one from which a piezoelectric layer having high crystallinity can be formed. Furthermore, the supporting substrate 2 and the acoustic reflection layer 3 have a bonding surface therebetween; these two components may be bonded together using an adhesive or any other material that damps elastic waves. This preferred embodiment therefore makes it possible to use more effective bonding processes and materials for easily and reliably bonding a supporting substrate and an acoustic reflection layer for an elastic wave device than in the above preferred embodiment. A possible explanation for this is the following. Plate waves propagating in the piezoelectric layer are reflected by the acoustic reflection layer 3, and the energy of the elastic waves is trapped in the piezoelectric layer 4. The energy of the elastic waves thus cannot reach the bonding interface between the supporting substrate 2 and the acoustic reflection layer 3. As a result, the attenuation of plate waves at this bonding interface is reduced.

In this method it is also possible that an adhesive layer made of $SiO_2$ or a similar material is interposed between the supporting substrate 2 and the acoustic reflection layer 3.

A manufacturing method according to Preferred Embodiment 4 starts with forming the acoustic reflection layer 3 on the supporting layer 2. As in Preferred Embodiments 2 and 3, the acoustic reflection layer 3 can be produced in a form of film by any appropriate thin-film formation process. It is also possible to prepare the acoustic reflection layer 3 separately and bond this layer onto the supporting substrate 2 using an adhesive or by similar means. The piezoelectric layer 4 is then formed on the acoustic reflection layer 3 by a thin-film formation process such as CVD or sputtering. The IDT electrode 5 is then formed on the piezoelectric layer 4.

The manufacturing method according to Preferred Embodiment 4 requires no processing operations for making a piezoelectric body thinner. Using this method therefore leads to lower manufacturing cost and fewer processing operations. In this method, furthermore, the piezoelectric layer 4 can be formed with a small thickness and high precision by using a thin-film formation process.

In this method it is also possible to provide a buffer layer to increase the crystallinity of the piezoelectric layer 4 between the piezoelectric layer 4 and the acoustic layer 3. Examples of materials that can be used to form such a buffer layer include AlN, $LiTaO_3$, $LiNbO_3$, ZnO, and $Ta_2O_5$.

The IDT electrode and other electrodes used in various preferred embodiments of the present invention can be of any structure. The electrode structure for a one-port elastic wave resonator illustrated in FIG. 1B is not the only possible one; the electrode structure can be modified as appropriate to support various functions such as band-pass filters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a supporting substrate;
   an acoustic reflection layer on the supporting substrate;
   a piezoelectric layer on the acoustic reflection layer; and
   an IDT electrode on an upper or lower surface of the piezoelectric layer, the piezoelectric layer being thinner than a period of fingers of the IDT electrode; wherein
   the acoustic reflection layer includes a low-acoustic-impedance layer and a high-acoustic-impedance layer having a higher acoustic impedance than an acoustic impedance of the low-acoustic-impedance layer;
   the low-acoustic-impedance layer is made of $SiO_2$, and the high-acoustic-impedance layer is made of at least one material selected from the group consisting of W, $LiTaO_3$, $Al_2O_3$, AlN, $LiNbO_3$, SiN, and ZnO;
   the piezoelectric layer is made of $LiNbO_3$ or $LiTaO_3$;
   Euler Angles of the $LiNbO_3$ of the piezoelectric layer are (0, 20, 0) to (0, 50, 0), (90, 90, 25) to (90, 90, 44), or (0, 95, 0) to (0, 132, 0); or
   Euler Angles of the $LiTaO_3$ of the piezoelectric layer are (0, 12, 0) to (0, 48, 0), (90, 90, 13) to (90, 90, 36), or (0, 100, 0) to (0, 134, 0).

2. The elastic wave device according to claim 1, wherein the high-impedance layer is made of at least one material selected from the group consisting of $LiTaO_3$, $Al_2O_3$, AlN, $LiNbO_3$, SiN, and ZnO.

3. A method for manufacturing the elastic wave device according to claim 1, comprising:
   forming the acoustic reflection layer on the supporting substrate;
   putting the piezoelectric layer on the acoustic reflection layer; and
   forming the IDT electrode on the piezoelectric layer.

4. The method for manufacturing an elastic wave device according to claim 3, wherein the piezoelectric layer is formed on the acoustic reflection layer by bonding a piezoelectric layer onto the acoustic layer and making the piezoelectric layer thinner.

5. The method for manufacturing an elastic wave device according to claim 3, wherein the piezoelectric layer is put on the acoustic reflection layer by producing the piezoelectric layer in a form of a film on the acoustic reflection layer.

6. A method for manufacturing the elastic wave device according to claim 1, comprising:
forming the acoustic reflection layer on a piezoelectric body thicker than the piezoelectric layer;
bonding the supporting substrate to a surface of the acoustic reflection layer opposite to a surface on which the piezoelectric body is disposed;
making the piezoelectric body thinner; and
forming the IDT electrode on the piezoelectric layer.

7. The elastic wave device according to claim 1, further comprising a plurality of the high-acoustic-impedance layers and a plurality of the low-acoustic-impedance layers alternatingly stacked on each other in a stacking direction.

8. The elastic wave device according to claim 1, further comprising reflectors arranged such that the IDT electrode is disposed between the reflectors to define a one-port elastic wave resonator.

9. The elastic wave device according to claim 8, wherein the reflectors are made of at least one of Al, Cu, Pt, Au, Ti, Ni, Cr, Ag, W, Mo, Ta.

10. The elastic wave device according to claim 1, further comprising one of a temperature compensation film, a protection film, and a frequency adjustment film disposed on the IDT electrode.

11. The elastic wave device according to claim 1, further comprising at least one insulating film made of $SiO_2$, SiN, or $Al_2O_3$ disposed on the IDT electrode.

12. The method for manufacturing an elastic wave device according to claim 3, further comprising forming a plurality of the high-acoustic-impedance layers and a plurality of the low-acoustic-impedance layers alternatingly stacked on each other in a stacking direction.

13. The method for manufacturing an elastic wave device according to claim 3, further comprising forming reflectors such that the IDS electrode is disposed between the reflectors to define a one-port elastic wave resonator.

14. The method for manufacturing an elastic wave device according to claim 13, wherein the reflectors are made of at least one of Al, Cu, Pt, Au, Ti, Ni, Cr, Ag, W, Mo, Ta.

15. The method for manufacturing an elastic wave device according to claim 3, further comprising forming one of a temperature compensation film, a protection film, and a frequency adjustment film on the IDT electrode.

16. The method for manufacturing an elastic wave device according to claim 3, further comprising forming at least one insulating film made of $SiO_2$, SiN, or $Al_2O_3$ on the IDT electrode.

17. The elastic wave device according to claim 1, wherein
the elastic wave device is configured to propagate $A_1$, $S_0$, or $SH_0$ mode plate waves;
the $A_l$ plate waves are anti-symmetric mode Lamb waves having one node in the thickness direction of the piezoelectric layer;
the $S_0$ mode plate waves are symmetric mode Lamb waves having no node in the thickness direction of the piezoelectric layer;
the $SH_0$ mode waves are shear horizontal waves having no node in the thickness direction of the piezoelectric layer; and
the Euler Angles of the $LiNbO_3$ or $LiTaO_3$ of the piezoelectric layer fall within a range specified in Table 1:

TABLE 1

| | Piezoelectric material | |
|---|---|---|
| Mode | $LiNbO_3$ | $LiTaO_3$ |
| $A_1$ | (0, 20, 0) to (0, 50, 0) | (0, 12, 0) to (0, 48, 0) |
| $S_0$ | (90, 90, 25) to (90, 90, 44) | (90, 90, 13) to (90, 90, 36) |
| $SH_0$ | (0, 95, 0) to (0, 132, 0) | (0, 100, 0) to (0, 134, 0). |

18. The elastic wave device according to claim 17, wherein the high-impedance layer is made of at least one material selected from the group consisting of $LiTaO_3$, $Al_2O_3$, AlN, $LiNbO_3$, SiN, and ZnO.

* * * * *